United States Patent [19]

Hokuyo et al.

[11] Patent Number: 4,997,491
[45] Date of Patent: Mar. 5, 1991

[54] SOLAR CELL AND A PRODUCTION METHOD THEREFOR

[75] Inventors: Shigeru Hokuyo; Takao Oda; Hideo Matsumoto, all of Itami, Japan

[73] Assignee: Mitsubishi Denki Kabushiki Kaisha, Japan

[21] Appl. No.: 436,663

[22] Filed: Nov. 15, 1989

[30] Foreign Application Priority Data

Nov. 16, 1988 [JP] Japan ................. 63-290990

[51] Int. Cl.$^5$ ................. H01L 31/078; H01L 31/18
[52] U.S. Cl. ................. 136/255; 136/262; 357/30; 437/2; 437/5
[58] Field of Search ................. 136/255, 262; 437/2-5; 357/30 J

[56] References Cited

U.S. PATENT DOCUMENTS

| | | | |
|---|---|---|---|
| 4,323,719 | 4/1982 | Green | 136/249 MS |
| 4,481,378 | 11/1984 | Lesk | 136/244 |
| 4,846,896 | 7/1989 | Hokuyo | 136/255 |
| 4,933,022 | 6/1990 | Swanson | 136/249 MS |
| 4,935,067 | 6/1990 | Sato et al. | 136/255 |

FOREIGN PATENT DOCUMENTS

| | | | |
|---|---|---|---|
| 1320775 | of 1963 | France | 136/255 |
| 57-184255 | 11/1982 | Japan | 136/255 |
| 57-204180 | 12/1982 | Japan | 136/255 |
| 61-67968 | 4/1986 | Japan | 136/255 |

*Primary Examiner*—Aaron Weisstuch
*Attorney, Agent, or Firm*—Leydig, Voit & Mayer

[57] ABSTRACT

A solar cell includes a first conductivity type semiconductor substrate having two opposed surfaces, a second conductivity type first semiconductor layer disposed in the substrate at the first surface of the semiconductor substrate, a second conductivity type second semiconductor layer deposited on the first surface of the semiconductor substrate except for the first semiconductor layer production region, producing a pn junction with the semiconductor substrate having no reverse direction voltage blocking capability, a first conductivity type third semiconductor layer deposited on the second semiconductor layer, a first electrode covering the first semiconductor layer and connecting the third semiconductor layer with the first semiconductor layer, and a second electrode disposed at a second surface of the semiconductor substrate.

18 Claims, 3 Drawing Sheets

SOLAR CELL AND A PRODUCTION METHOD THEREFOR

FIELD OF THE INVENTION

The present invention relates to a solar cell and a production method therefor and, more particularly, to a solar cell that is not damaged by the reverse direction voltage which arises when one solar cell in a module of serially connected solar cells is shaded and that minimizes the reduction in the output of the solar cell module.

BACKGROUND OF THE INVENTION

A solar cell fundamentally comprises a diode having a pn junction. When solar cells are to be used for generation of electricity in practical use, a plurality of solar cells are serially connected to obtain a voltage which is a sum of voltages of the respective cells. When one of the serially connected cells is shaded, however, it is subjected to a reverse direction voltage which is generated by the other serially connected cells. In that case, the shaded cell will block current flow, thereby reducing the output of the solar cell module to a great extent. Furthermore, when the reverse breakdown voltage of the solar cell is low the solar cell may be damaged or destroyed.

In order to prevent this phenomenon, it is necessary to enhance the reverse breakdown voltage of the solar cell or to connect diodes in parallel and in reverse polarity with the junction of the solar cell so that the total voltage of the series connected solar cells does not exceed the reverse breakdown voltage of a cell.

The enhancement in the reverse direction blocking voltage of the solar cell is realized by lowering the impurity concentration of the base layer of the cell. However, solar cells are generally required to have shallow pn junctions and, in particular, in solar cells used in space, the depth of the pn junction is required to be less than 0.3 to 0.5 microns in order to enhance short wavelength sensitivity. It is experimentally possible to make such a pn junction by diffusing impurities into a base layer having the required impurity concentration and obtain a blocking voltage of several hundred volts, but it is quite difficult to do so in mass production. Furthermore, in a GaAs solar cell, it is difficult to produce a base layer of sufficiently low impurity concentration due to the presence of impurities such as $O_2$ in the GaAs. A reverse breakdown voltage of several tens of volts, at the most, is obtained. Thus, there is a limitation in the enhancement of the reverse breakdown voltage of a solar cell.

Furthermore, a device including a diode connected in reverse parallel with a solar cell to bypass a reverse direction voltage is effective but requires space for the external diodes. This leads to a costly device due to the diode connection and reduces system reliability due to an increase in the number of parts. Especially in extra-terrestrial use, which requires high reliability, these problems are important.

There is another method of producing independent diodes which are connected in reverse polarity and parallel with the respective cells of a solar cell device to obtain the same effects as the insertion of external reverse polarity, parallel connected diodes. In order to include a bypass diode simply, the n(p) layer of the solar cell may be electrically isolated from the n(p) layer of the bypass diode, and two cells (p-n junction) may be mutually isolated on an insulating substrate, producing both the solar cell function and the bypass diode function.

FIGS. 3 to 5 show a solar cell element of the structure disclosed in Japanese Published Patent Application 57-204180. FIG. 3 shows a plan view of such a solar cell and FIGS. 4 and 5 show cross-sections taken along lines a—a' and b—b' of FIG. 3, respectively.

In these Figures, reference numeral 1 designates a semi-insulating substrate, such as GaAs. An n-type GaAs layer 2, a p-type GaAs layer 3, and a p-type AlGaAs layer 4 are successively disposed on the substrate 1 on one side thereof and an n-type GaAs layer 5, a p-type GaAs layer 6, and a p-type AlGaAs layer 7 are successively disposed on the substrate 1 on the other side thereof. The layers from n-type GaAs layer 2 to p-type AlGaAs layer 4 constitute a solar cell and the layers from n-type GaAs layer 5 to p-type AlGaAs layer 7 constitute a blocking diode. Reference numeral 8 designates an insulating film which functions also as a reflection preventing film. The p-type AlGaAs layer 4 and the n-type GaAs layer 5 are connected by a positive side electrode 9, and the n-type GaAs layer 2 and the p-type AlGaAs layer 7 are connected by a negative side electrode 10, respectively. Accordingly, in the usual state of the above-described construction, a negative voltage is generated at the n-type GaAs layer 2 and a positive voltage is generated at the p-type GaAs layer 3. However, a reverse direction diode is produced by the n-type GaAs layer 5 and the p-type GaAs layer 6. This diode is not affected by the solar cell operation. When a reverse direction voltage is applied to the layers 2 and 3, that is, a positive voltage is applied to the n-type GaAs layer 3, and a negative voltage is applied to the p-type GaAs layer 5, a positive voltage will be applied to the p-type GaAs layer 6, forward biasing the diode constituted by the n-type GaAs layer 5 and the p-type GaAs layer 6. Then, only a voltage resulting from the forward direction voltage drop of the diode is applied to the n-type GaAs layer 2 and the p-type GaAs layer 3 of the solar cell. As a result, the solar cell will be protected by the diode from the reverse direction voltage.

In a solar cell having the structure shown in FIGS. 3 to 5, however, since a semi-insulating substrate is used as the substrate 1, it is not possible to produce an electrode opposite the light receiving surface of the solar cell, i.e., at the rear surface of the substrate. On the contrary, it is required to expose a portion of the n-type GaAs layer 2 which is disposed on the insulating substrate at a portion of the light receiving surface and to deposit an n-type electrode 10 thereon. Therefore, in large area solar cells, the internal series resistance of the solar cell is increased by the lateral resistance of the n-type GaAs layer 2, and the conversion efficiency is reduced. Furthermore, in order to expose a portion of the n-type layer 2 at a portion of the light receiving surface, the etching depth has to be strictly controlled when selectively removing the p-type layer 3, for example, by wet etching. However, when the p-type layer 3 and the n-type layer 2 are the same material, strict control of the etching depth is quite difficult. Furthermore, when a plurality of solar cells are connected in series, a large amount of heat is applied in making connections to the front surface electrodes and the external connector may reach a temperature above 500° C. In a GaAs solar cell, the depth of the pn junction at the solar cell is limited to about 0.5 microns as discussed above, and the pn junction may be damaged by heat, thereby adversely affecting operating characteristics or cracking the GaAs. These considerations restrict the conditions of the interconnection process.

SUMMARY OF THE INVENTION

It is an object of the present invention to provide a solar cell including reverse parallel diodes on the same semiconductor substrate which prevents electro-motive force generation by the reverse parallel diodes.

Another object of the present invention is to provide a production method for producing a highly efficient solar cell in a simple process.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In a solar cell according to the present invention, a second conductivity type first semiconductor layer is produced as a reverse polarity, parallel connected diode at a solar cell portion of a first conductivity type semiconductor substrate, and a solar cell is produced by successively depositing a second conductivity type second semiconductor layer and a first conductivity type third semiconductor layer on a substrate surface except for the reverse polarity, parallel connected diode section. The pn junction between the semiconductor substrate surface and the solar cell has almost no reverse breakdown voltage. Furthermore, a surface electrode metal layer which connects the third semiconductor layer and the first semiconductor layer covers the entire surface of the reverse polarity, parallel connected diode portion and the other electrode is produced at the rear surface of the substrate. Accordingly, the light having wavelengths contributing to voltage light generation which can reach the pn junction of the reverse parallel diode can be perfectly intercepted, thereby preventing electro-motive force generation in the reverse parallel diode. Furthermore, when a solar cell connected in series is shaded, the reverse polarity, parallel connected diode is biased in a forward direction so that no reverse voltage is applied to the pn junction of a solar cell. Since the reverse polarity, parallel connected diodes are electrically separated by pn junctions in the substrate, the production process of the reverse polarity, parallel connected diode can be greatly simplified. The electrode portion opposite the reverse polarity, parallel connected diode can be used for making the external connection without any reduction in the effective light receiving area.

DETAILED DESCRIPTION OF THE PREFERRED EMBODIMENT

Figure 1:
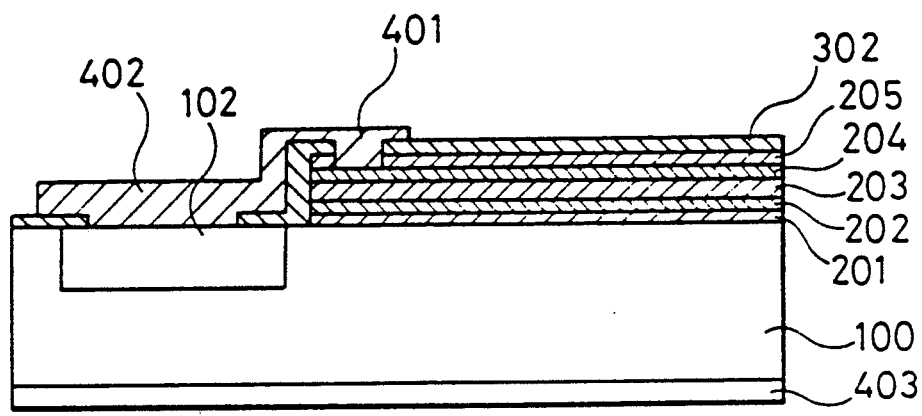
FIG. 1 is a cross-sectional view of a solar cell according to an embodiment of the present invention.

FIG. 1 shows a cross-sectional view of the structure of a solar cell according to an embodiment of the present invention. In FIG. 1, reference numeral 100 designates a p-type Ge substrate. An n-type Ge layer 102 is disposed in and at a front surface of the p-type Ge substrate 100. An n-type GaAs high dopant concentration impurity layer 201 is disposed on the p-type Ge substrate 100. A lattice matching layer 202 is disposed on the n-type GaAs layer 201. An n-type GaAs layer 203 is disposed on the lattice matching layer 202. A p-type GaAs layer 204 is disposed on the n-type GaAs layer 203. A p-type AlGaAs layer 205 is disposed on the p-type GaAs layer 204. A reflection preventing layer 302 is disposed on the AlGaAs layer 205. Reference numeral 401 designates a solar cell first electrode, reference numeral 402 designates a solar cell connecting electrode integrated with the electrode 401, and reference numeral 403 designates a solar cell second electrode.

Figure 2:
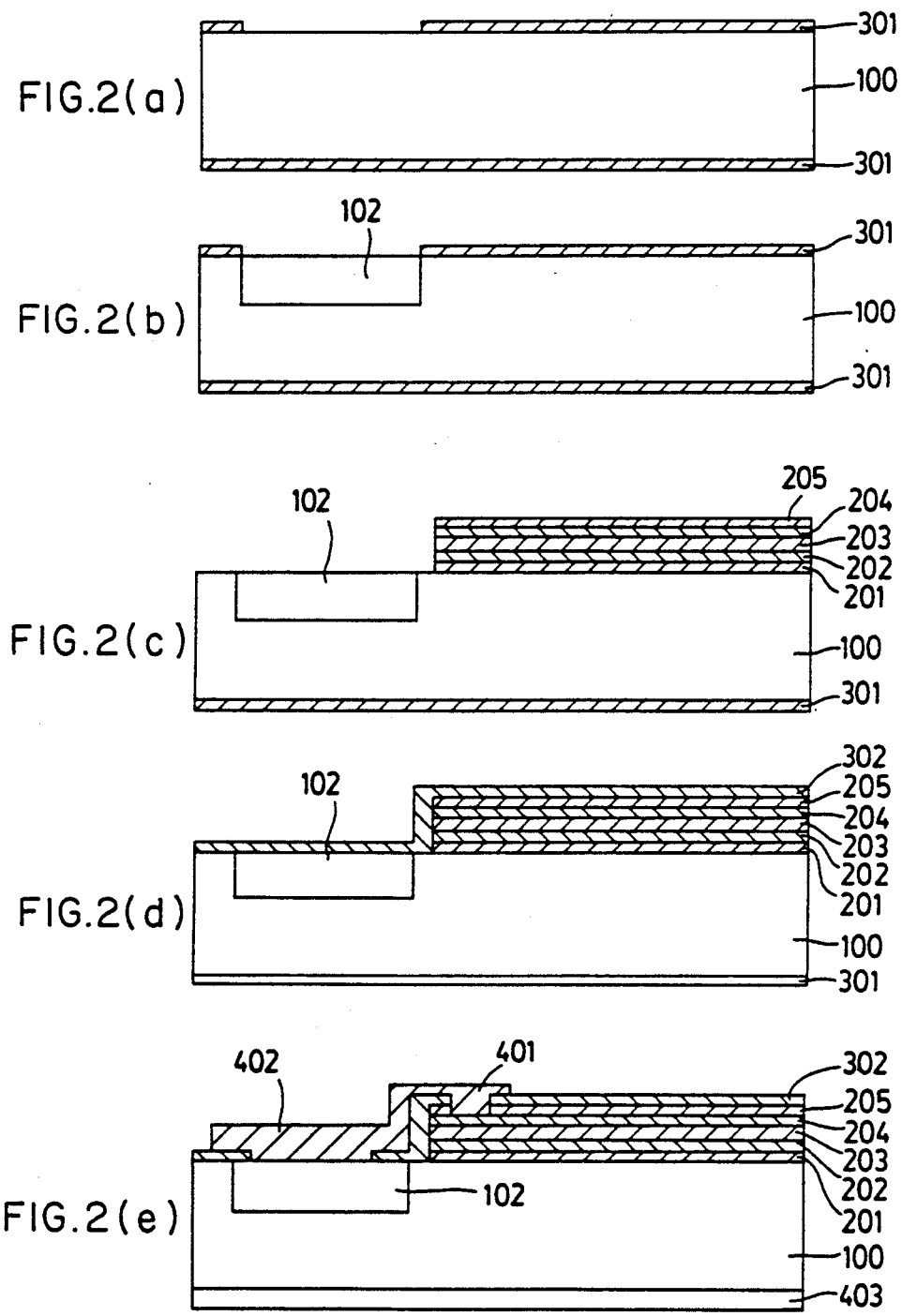
FIGS. 2(a) to 2(e) are diagrams illustrating respective production process steps for producing the solar cell of FIG. 1.
Figure 3:
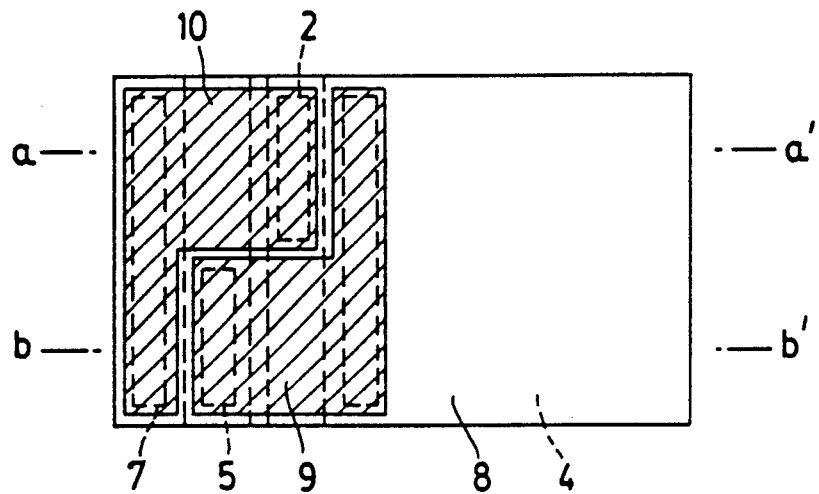
FIG. 3 is a plan view of a prior art solar cell.
Figure 4:
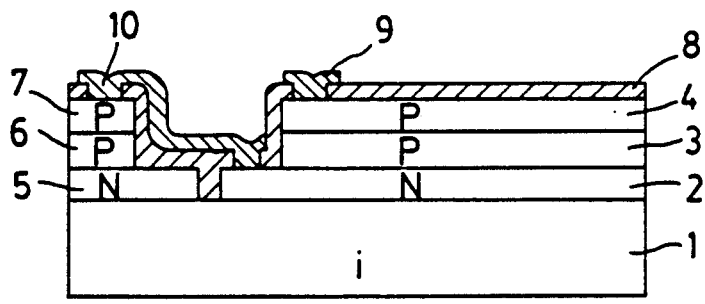
FIG. 4 is a cross-sectional view taken along line a—a' of FIG. 3.
Figure 5:
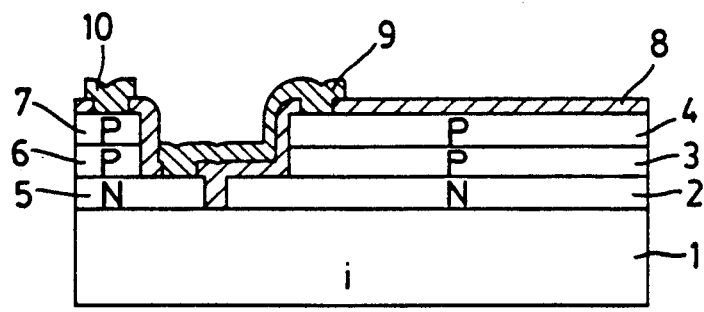
FIG. 5 is a cross-sectional view taken along line b—b' of FIG. 3.

FIGS. 2(a) to 2(e) illustrate production process steps for producing the solar cell of FIG. 1. As shown in FIG. 2(a), a silicon nitride film 301 is deposited on both surfaces of a p-type Ge substrate 100 having a thickness of 100 to 300 microns. The silicon nitride film 301 is deposited to a thickness of about 1000 Angstroms by chemical vapor deposition (CVD). Herein, in order to make it easier to make an ohmic contact to the n-type GaAs high concentration impurity layer which will be produced later, the impurity concentration of the surface of the substrate is at least $1 \times 10^{17}$ cm$^{-3}$ and preferably about $1 \times 10^{18}$ cm$^{-3}$. When a substrate having impurity concentrations of below $1 \times 10^{17}$ cm$^{-3}$ is used, a high concentration p-type layer is required to be produced by diffusion of boron into a predetermined portion of a region of the surface of the p-type substrate for producing a solar cell function.

Thereafter, as shown in FIG. 2(b), a portion of silicon nitride film 301 is removed by photolithography, and phosphorus (P) is diffused through this aperture, thereby producing an n-type Ge layer 102. As shown in FIG. 2(c), the silicon nitride film 301 at the front surface of the substrate 100 is removed. An n-type high dopant impurity concentration GaAs layer 201 of a film thickness of 100 to 1000 Angstroms, a lattice matching layer 202 comprising a superlattice layer which comprises alternatingly disposed AlGaAs and GaAs layers having film thicknesses of 100 Angstroms, respectively, an n-type GaAs layer 203 of a film thickness of 3 to 5 microns, a p-type GaAs layer 204 of a film thickness of 0.3 to 0.5 microns, and a p-type $Al_x Ga_{1-x} As$ ($X = 0.8$ to 0.9) layer 205 having a film thickness below 0.1 micron are successively grown by metal organic chemical vapor deposition (MOCVD) or molecular beam epitaxy (MBE). The impurity concentration of the n-type GaAs layer 201 is preferably below about $1 \times 10^{18}$ cm$^{-3}$. A predetermined portion of the epitaxial layer, including at least a portion of the Ge substrate surface, is removed by etching, thereby separating the solar cell function portion and the reverse polarity, parallel connected diode portion from each other.

Thereafter, as shown in FIG. 2(d), a silicon nitride film 302 as a reflection preventing film and an insulating film for metal wiring is deposited.

Thereafter, as shown in FIG. 2(e), portions of the silicon nitride film 302 and the p-type AlGaAs layer 205 at predetermined regions of the front surface and rear surface are removed by photolithography, and an electrode metal layer is deposited at predetermined portions of the reverse polarity, parallel connected diode and the solar cell function portion by sputtering or CVD. In other words, the front surface electrode 401 of the solar cell connects the p-type GaAs layer 204 and the n-type Ge layer 102, and the rear surface electrode 403 is disposed on the entire rear surface of the p-type Ge substrate 100. Then, the front surface electrode is deposited, completely covering the pn junction at the surface of the Ge substrate 100 and the n-type Ge layer 102. When the solar cell is used in space as a power supply for an artificial satellite, the connection between the electrode of the solar cell and the external connector is often made by welding, such as by the parallel gap welding method. Then the front surface electrode has an area of about 5 mm × 10 mm for welding to the external connection. The electrode 401 on the n-type Ge layer 102 is preferably formed in a pattern.

In such a solar cell, incident light generates a photovoltage between the p-type GaAs layer 204 and the n-type GaAs layer 203, i.e., a positive voltage at the anode electrode 401 and a negative voltage at the cathode electrode 403. The reverse polarity, parallel connected diode comprising the p-type Ge substrate 100 and the n-type Ge layer 102 generates a photovoltage in a reverse direction from the solar cell. However, the entire surface of the diode is covered by the electrode metal 402 so that no electricity is generated to interfere with the solar cell function. Furthermore, in a solar cell module serially connected through the external connection electrodes 401 and 403, when a portion of the solar cell is shaded, a reverse voltage is applied and the anode electrode 401 is biased at a negative voltage while the cathode electrode 403 is biased at a positive voltage. However, the reverse polarity, parallel connected diode is biased in a forward direction, and a current flows from the cathode electrode 403 through the reverse polarity, parallel connected diode to the anode electrode 401. Accordingly, a reverse direction voltage is not applied to the solar cell pn junction.

As described above, the solar cell of the present invention has a reverse direction current conducting capability so that the element will not be destroyed by a reverse direction voltage. Because there is no necessity of inserting an external diode, the number of parts is not increased. The reverse polarity, parallel connected diode can be made independently by selective etching after producing a pn junction at the substrate, thereby simplifying processing. Furthermore, while welding the solar cell front surface electrode 401 with an external connector, by attaching the electrode to the n-type Ge layer 102 as a welding terminal, damage to the pn junction at the solar cell and cracking of the GaAs layer can be prevented. The adhesion of the electrode metal to the semiconductor substrate is superior to that of the insulating film and the electrode on the n-type Ge layer 102 is a superior welding electrode. By producing a welding electrode which is required to have an area of some size on the n-type Ge layer 102, it is possible to suppress any reduction in the effective light receiving area due to the production of bypass diodes at the front surface.

While in the above-described embodiment a p-type on n-type GaAs/Ge solar cell is described, the present invention can be applied to any solar cell, such as a GaAs/Si solar cell, without being restricted to p on n or n or p solar cells.

In the production method of the above-described embodiment, a solar cell including a pn junction is produced on the entire surface of the substrate and, thereafter, the reverse polarity, parallel connected diode is prepared by etching. However, layers including pn junctions may be produced by epitaxy after an epitaxial growth blocking layer, such as a silicon nitride film, is produced at a predetermined region including a pn junction portion and an n(p)-type Ge layer at the surface of the Ge substrate before producing a solar cell. Then a solar cell which is independent from the beginning can be produced.

As is evident from the foregoing description, according to the present invention, a bypass diode is produced by providing a semiconductor layer having a reverse conductivity type to that of a substrate at a surface of the semiconductor substrate, and a solar cell function portion is produced on the substrate except for the bypass diode production region. Meanwhile, the pn junction between the semiconductor substrate surface and the solar cell function portion has almost no reverse direction voltage blocking capability, and one electrode is disposed connecting the solar cell and the bypass diode, covering the entire surface of the bypass diode. The other electrode is produced at the rear surface of the substrate. Accordingly, light that could generate a photovoltage is excluded from the reverse polarity, parallel connected diode so that the generation of an electro-motive force by the reverse polarity, parallel connected diode is prevented. Furthermore, since the reverse polarity, parallel connected diode portion is biased in a forward direction when a portion of the solar cell module is shaded, the application of a reverse voltage to a pn junction of a solar cell function portion is prevented. Since there is no necessity of inserting an external diode, it is not necessary to increase the number of parts and the reverse polarity, parallel connected diode is independently produced at the same time as the solar cell function portion is produced. Thereafter, selective etching separates them from each other which simplifies the processing. When welding the solar cell surface electrode to an eternal connector, by making the electrode on the reverse polarity, parallel connected diode portion a welding terminal, damage to and cracks in the pn junction of the solar cell function portion is prevented and a reduction in the effective light receiving area due to the production of the bypass diode at the light receiving surface is suppressed.

What is claimed is:
1. A solar cell comprising:
   a first conductivity type semiconductor substrate having opposed first and second surfaces;
   a second conductivity type semiconductor region disposed in said substrate at a portion of the first surface thereof;
   a second conductivity type first semiconductor layer disposed on said first surface of said semiconductor substrate producing a pn junction with said semiconductor substrate having essentially no reverse breakdown voltage;
   a first conductivity type second semiconductor layer disposed on said first semiconductor layer and forming a photovoltaic junction therewith;
   a first electrode covering said semiconductor region and connecting said second semiconductor layer with said first semiconductor region; and
   a second electrode disposed on said second surface of said semiconductor substrate;

2. A solar cell as defined in claim 1 wherein a second conductivity type high dopart impurity concentration semiconductor layer is disposed between said first conductivity type semiconductor substrate and said second conductivity type first semiconductor layer.

3. A solar cell as defined in claim 2 wherein a lattice matching layer is disposed between said second conductivity type high impurity concentration semiconductor layer and said second conductivity type first semiconductor layer.

4. A solar cell as defined in claim 1 wherein a window layer is disposed on said second semiconductor layer.

5. A solar cell as defined in claim 4 wherein a reflection preventing film is disposed on said window layer.

6. A solar cell as defined in claim 1 comprising a GaAs/Ge solar cell.

7. A solar cell as defined in claim 6 wherein said semiconductor substrate comprises a p type Ge layer, said semiconductor region comprises an n type Ge layer, said first semiconductor layer comprises an n type GaAs layer, and said second semiconductor layer comprises a p type GaAs layer.

8. A solar cell as defined in claim 1 wherein said solar cell comprises a GaAs/Si solar cell.

9. A solar cell as defined in claim 1 wherein a region of said first electrode which is disposed on said first surface of said semiconductor substrate is an external connector connection portion.

10. A method of producing a solar cell, comprising the steps of:
producing a second conductivity type semiconductor region in and at a portion of a first surface of a first conductivity type semiconductor substrate;
growing a second conductivity type first semiconductor layer on said first surface of said semiconductor substrate to form a pn junction with said semiconductor substrate having essentially no reverse breakdown voltage;
growing a first conductivity type second semiconductor layer on said first semiconductor layer;
depositing an insulating film covering the entire first surface;
removing a desired portion of said insulating film;
depositing a first electrode covering the entire surface on said semiconductor region and connecting said first semiconductor region and said second semiconductor layer; and
depositing a second electrode on the second surface of said semiconductor substrate.

11. A method of producing a solar cell as defined in claim 10 including growing a second conductivity type high dopant concentration layer and a lattice matching layer successively on said first surface of said semiconductor substrate before growing said second conductivity type first semiconductor layer on said semiconductor substrate.

12. A method of producing a solar cell as defined in claim 10 including growing said second conductivity type first semiconductor layer, and said first conductivity type second semiconductor layer successively on said first surface of said semiconductor substrate, and thereafter removing portions thereof opposite said semiconductor region by etching.

13. A method of producing a solar cell as defined in claim 10 including depositing an epitaxial growth blocking layer at a predetermined position including a portion opposite said semiconductor region in said first surface of said semiconductor substrate, and thereafter successively growing said second conductivity type first semiconductor layer and said first conductivity type second semiconductor layer.

14. A method of producing a solar cell as defined in claim 10 including depositing a window layer on said second semiconductor layer.

15. A method of producing a solar cell as defined in claim 10 wherein said solar cell comprises a GaAs/Ge solar cell.

16. A method of producing a solar cell as defined in claim 15 wherein said semiconductor substrate comprises p type Ge, said semiconductor region comprises n type Ge, said first semiconductor layer comprises an n type GaAs layer, and said second semiconductor layer comprises a p type GaAs layer.

17. A method of producing a solar cell as defined in claim 10 wherein said solar cell comprises a GaAs/Si solar cell.

18. A method of producing a solar cell as defined in claim 10 of said first electrode wherein a region opposite said semiconductor region is disposed in said first surface of said semiconductor substrate, as an external connector connection portion.

* * * * *